(12) United States Patent
Fogaça et al.

(10) Patent No.: US 11,461,530 B1
(45) Date of Patent: Oct. 4, 2022

(54) CIRCUIT DESIGN ROUTING BASED ON ROUTING DEMAND ADJUSTMENT

(71) Applicant: Cadence Design Systems, Inc., San Jose, CA (US)

(72) Inventors: Mateus Paiva Fogaça, Porto Alegre (BR); Gracieli Posser, Austin, TX (US); Wing-Kai Chow, Austin, TX (US); Mehmet Can Yildiz, Austin, TX (US); Zhuo Li, Austin, TX (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 17/231,983

(22) Filed: Apr. 15, 2021

(51) Int. Cl.
*G06F 30/00* (2020.01)
*G06F 30/3947* (2020.01)
*G06F 30/394* (2020.01)

(52) U.S. Cl.
CPC ........ *G06F 30/3947* (2020.01); *G06F 30/394* (2020.01)

(58) Field of Classification Search
CPC .................... G06F 30/3947; G06F 30/394
See application file for complete search history.

(56) References Cited

U.S. PATENT DOCUMENTS

| | | | | |
|---|---|---|---|---|
| 8,065,652 | B1* | 11/2011 | Sal ........................ | G06F 30/394 |
| | | | | 716/120 |
| 8,584,070 | B2* | 11/2013 | Alpert ................... | G06F 30/394 |
| | | | | 716/129 |
| 10,268,795 | B2* | 4/2019 | Chuang .................... | G06N 3/08 |
| 10,489,542 | B2* | 11/2019 | Ren .......................... | G06N 3/08 |
| 10,747,935 | B2* | 8/2020 | Li ......................... | G06F 30/394 |
| 10,885,257 | B1* | 1/2021 | Posser ................... | G06F 30/398 |
| 10,997,352 | B1* | 5/2021 | Posser ................... | G06F 30/327 |

OTHER PUBLICATIONS

Hsu et al.; Routability-Driven Analytical Placement for Mixed-Size Circuit Designs; IEEE; 2011; pp. 80-84.*

* cited by examiner

*Primary Examiner* — Naum Levin
(74) *Attorney, Agent, or Firm* — Schwegman Lundberg & Woessner, P.A.

(57) ABSTRACT

Various embodiments provide for routing a circuit design based on adjusting a routing demand. More specifically, some embodiments implement routing demand smoothing of a grid cell, routing overflow spreading of a grid cell, or some combination of both prior to detailed routing of a circuit design, which can result in improved detailed routing over conventional routing techniques.

19 Claims, 12 Drawing Sheets

US 11,461,530 B1

CIRCUIT DESIGN ROUTING BASED ON ROUTING DEMAND ADJUSTMENT

TECHNICAL FIELD

Embodiments described herein relate to circuit design and, more particularly, to systems, methods, devices, and instructions for routing a circuit design based on adjusting a routing demand, which can be part of electronic design automation (EDA).

BACKGROUND

Electronic design automation (EDA) software systems commonly perform routing of networks of circuit designs, such as clock networks (hereafter, clock nets). Usually, a network of a circuit design comprises a set of pins, and a routing process can route a path to connect the network. Net routing can be performed in two phases, where the first phase involves routing guides (e.g., global routing paths) that attempt to generate timing-aware/timing-based global routing of nets, and the second phase involves detailed routing of nets with specific wires (e.g., metal traces) based on the routing guides, while attempting to resolve/avoid one or more design rule violations.

Global routing can comprise two-dimensional (2D) net routing, layer assignment of wires of nets, or track assignment of wires of nets. Resolving congestion and major design rule constraints (DRCs) during global routing can facilitate detailed routing of nets. Conventional global routing can route nets of a circuit design by dividing the circuit design (e.g., each layer of the circuit design) into a grid of cells (also referred to as "global routing cells," "grid cell," or "g-cells"), where each grid cell comprises a set number of resources (e.g., horizontal and vertical resources, such as tracks) for routing a net, referred to as capacity, and a number of resources that are currently being used or demanded by global routing to route a network, referred to as routing demand or demand. A cell can be square or rectangle in shape. Routing overflow (or overflow) for a given grid cell is usually determined by subtracting the demand for the given grid from the capacity of the given grid, where an overflow comprising a negative number indicates more demand for routing resources than available capacity of resources. A grid cell can be considered congested if the number of resources of the grid cell is less than what is needed to route a network through the grid cell, which is indicated by a negative number for overflow.

Based on the grid of cells, global routing can route a net of the circuit design by assigning the net to a set of specific grid cells and a set of specific layers (metal layers) of the circuit design. Generally, using grid cells permits global routing to speed up the process of finding net routing solutions by analyzing routing congestion based on grid cell congestion and by reducing the number of pathways to consider for net routing.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
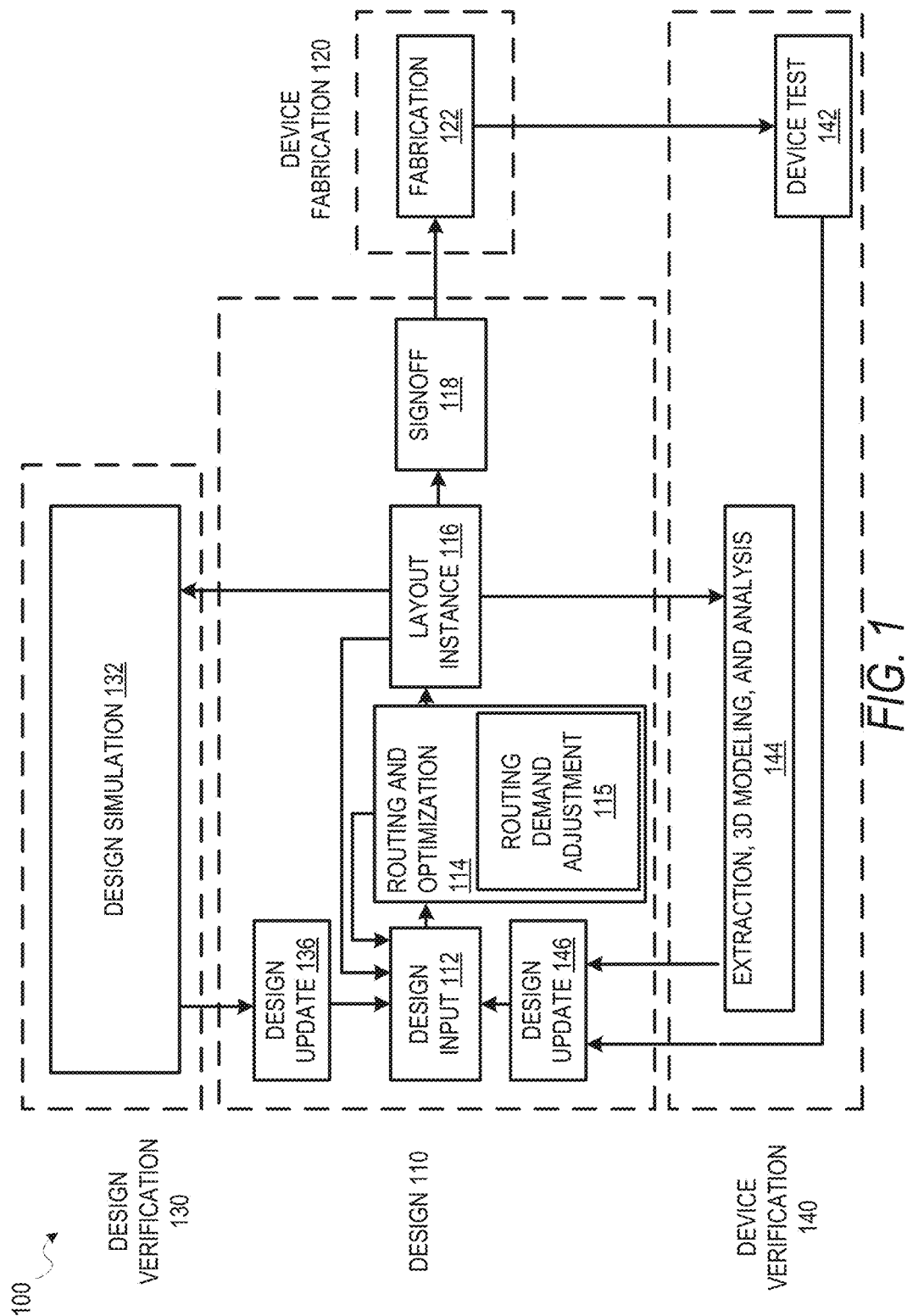
FIG. 1 is a diagram illustrating an example design process flow for routing a circuit design based on adjusting a routing demand, according to some embodiments.

Various embodiments provide for routing a circuit design based on adjusting a routing demand, which can be part of electronic design automation (EDA). More specifically, some embodiments implement routing demand smoothing of a grid cell, routing demand spreading (e.g., routing overflow spreading) of a grid cell, or some combination of both prior to detailed routing of a circuit design, which can result in improved detailed routing over conventional routing techniques.

EDA tools often use a global routing process (e.g., via a global routing engine) to estimate routing congestion and optimize routability of a circuit design using a congestion map. However, the resulting congestion map can include uneven distribution of routing congestion, also referred to herein as bumps. Such bumps can cause miscorrelations between the congestion map of the circuit design and the detailed routing of the circuit design, which can mislead routing optimization processes, and negatively impact power, timing, and/or area of the detail-routed circuit design. Usually, the correlation between a congestion map of a circuit design and detailed routing of the circuit design can be a key factor in correct routing guide optimization. Conventional methodologies attempt to solve the bumpiness of the congestion map with more global routing effort, which can increase the overall runtime of the global routing process.

Various embodiments described herein provide a method for adjusting routing demand of one or more grid cells of a circuit design by either routing demand smoothing or routing demand spreading (e.g., routing overflow spreading), which can address bumps within a congestion map used to perform detailed routing of the circuit design. For some embodiments, routing demand of one or more grid cells of a circuit design is adjusted by both routing demand smoothing and routing demand spreading to address bumps within a congestion map. According to some embodiments, routing demand smoothing can remove one or more bumps from a congestion map by adjusting a routing demand of an individual grid cell (of a layer) of a circuit design based on an average routing demand (e.g., average routing congestion) of one or more grid cells neighboring (e.g., within a certain range of) the individual grid cell. This can be performed for each grid cell described in the congestion map. While smoothing routing demand, some embodiments avoid putting routing demand into grid cells that have a blocked region (e.g., comprising one or more blocked tracks).

Additionally, for some embodiments, routing demand spreading comprises transferring a routing demand of an individual grid cell (of a layer) of a circuit design to one or more grid cells that neighbor (e.g., within a certain range of) the individual grid cell and contain no blocked tracks (e.g., non-blocked, neighboring grid cells).

Depending on the embodiment, routing demand adjustment described herein can be performed as part of global routing and prior to detailed routing. Additionally, routing demand adjustment described herein can be performed prior to performance of a congestion optimization engine.

Unlike conventional technologies, various embodiments described herein can smooth routing demand in two dimensions, which provides more freedom for routing demand spreading. Additionally, conventional technologies, various embodiments described herein can adjust routing demand while being aware of routing blockages (e.g., blockage-aware routing demand adjustment). By use of various embodiments, a congestion map (generated by a global routing process) can be better optimized for use by a detailed routing process and can be better correlated with the actual routing performed by the detailed routing, which in turn can result in improved power, timing, and/or area of the detail-routed circuit design.

As used herein, global routing can comprise determining a routing plan (e.g., one or more routing guides) for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Additionally, for some embodiments, a routing blockage of a circuit design (e.g., on a layer of the circuit design) is marked with respect to a cell (e.g., grid cell) in the grid. Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailing routing can route a physical wire between two or more nodes (e.g., pins) of a circuit design.

As used herein, a routing blockage (or routing obstacle) can comprise a defined area of a circuit design that serves as an obstruction with respect to routing (e.g., routing a wire associated with a network of the circuit design, such as a clock net) through the defined area. For example, a routing blockage can be caused by a macro block included by a circuit design, which may be associated with a circuit design intellectual property (IP) block. A given routing blockage can comprise an area covering one or more layers of a circuit design (e.g., layers M1, M2, and M3). For various embodiments, circuit design routing routes a wire around a routing blockage.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more design rule constraints (DRCs) associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

As used herein, a congestion map can describe a measure (e.g., estimated measure) of routing congestion for a set of grid cells on layer(s) (e.g., metal layers) of a circuit design, where the layers serve as interconnect structures for the circuit design. A measure of routing congestion for a given grid cell can be represented by one or more congestion ratios, such as one ratio for a horizontal routing resource and another ratio for a vertical routing resource. For example, a congestion ratio for a horizontal routing resource of a given grid can comprise a total number of horizontal routing resources demanded from the given grid cell by circuit elements (e.g., logical devices of the circuit design) within the given grid cell, divided by a total number of horizontal routing resources available (supplied) by the given grid cell. A congestion map can be implemented as a data structure, such as a two-dimensional array, for storing measured interconnect congestion for individual cells of the set of grid cells.

As used herein, a capacity map can describe a measure of routing resource capacity of a set of grid cells for layer(s) of a circuit design, such as horizontal and vertical resources (e.g., tracks) for routing a wire through each grid cell. For some embodiments, a capacity map is used by global routing to generate a set of routing guides between at least two nodes of the circuit design (e.g., between two pins or between a source and a pin). A capacity map for a circuit design can be generated based on a congestion map. As used herein, via capacity for a given grid cell can describe a capacity available in the given grid cell for vias.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for adjusting routing demand of one or more grid cells of a circuit design, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floorplanning, placement, post-placement optimization, and post-routing optimization. As shown, the routing and optimization 114 operation includes a routing demand adjustment 115 operation, which may be performed in accordance with various embodiments described herein.

For some embodiments, the adjustment 115 operation can be performed prior to detailed routing of a circuit design and, more particularly, during (e.g., as part of) global routing of the circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

Design inputs are used in the design input 112 operation to generate an initial circuit layout. The design inputs may be further processed during the design input 112 operation via a process, such as logic synthesis, to generate a circuit netlist mapped to a target standard library manufacturable by the foundry in the fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
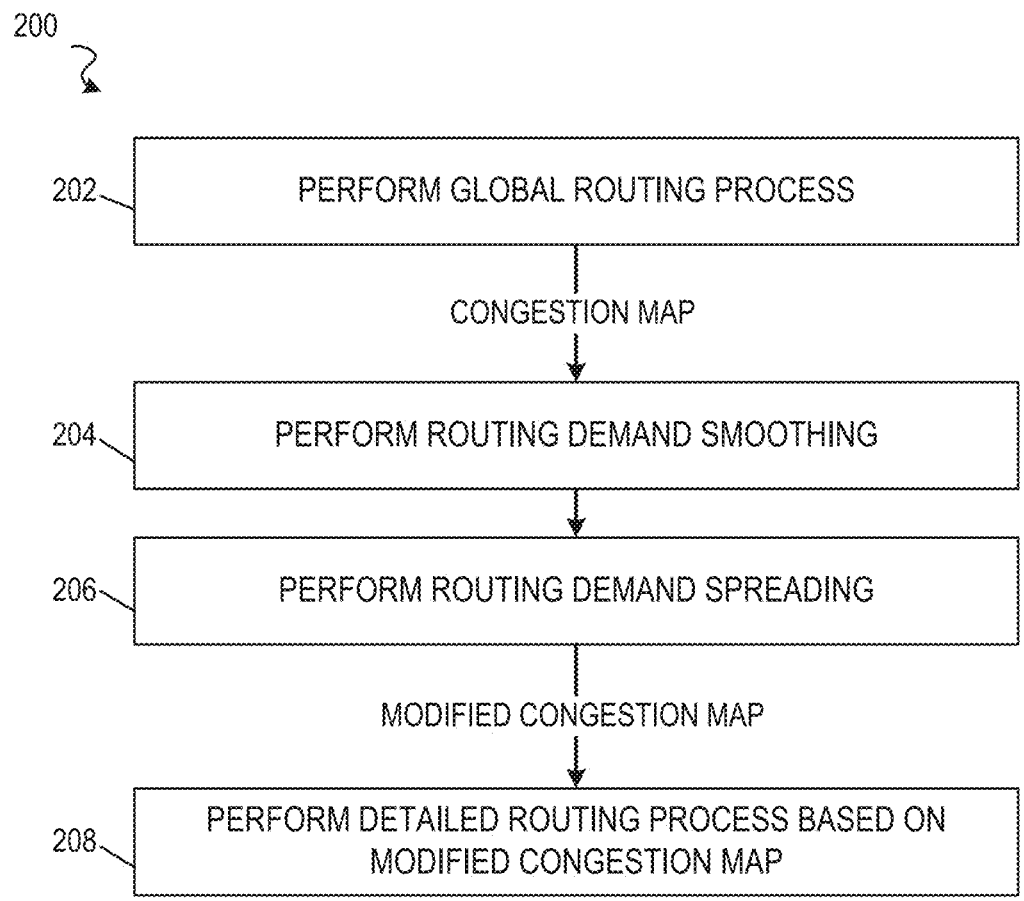
FIGS. 2 through 4 are flowcharts illustrating example methods for adjusting routing demand of one or more grid cells of a circuit design, according to some embodiments.
Figure 3:
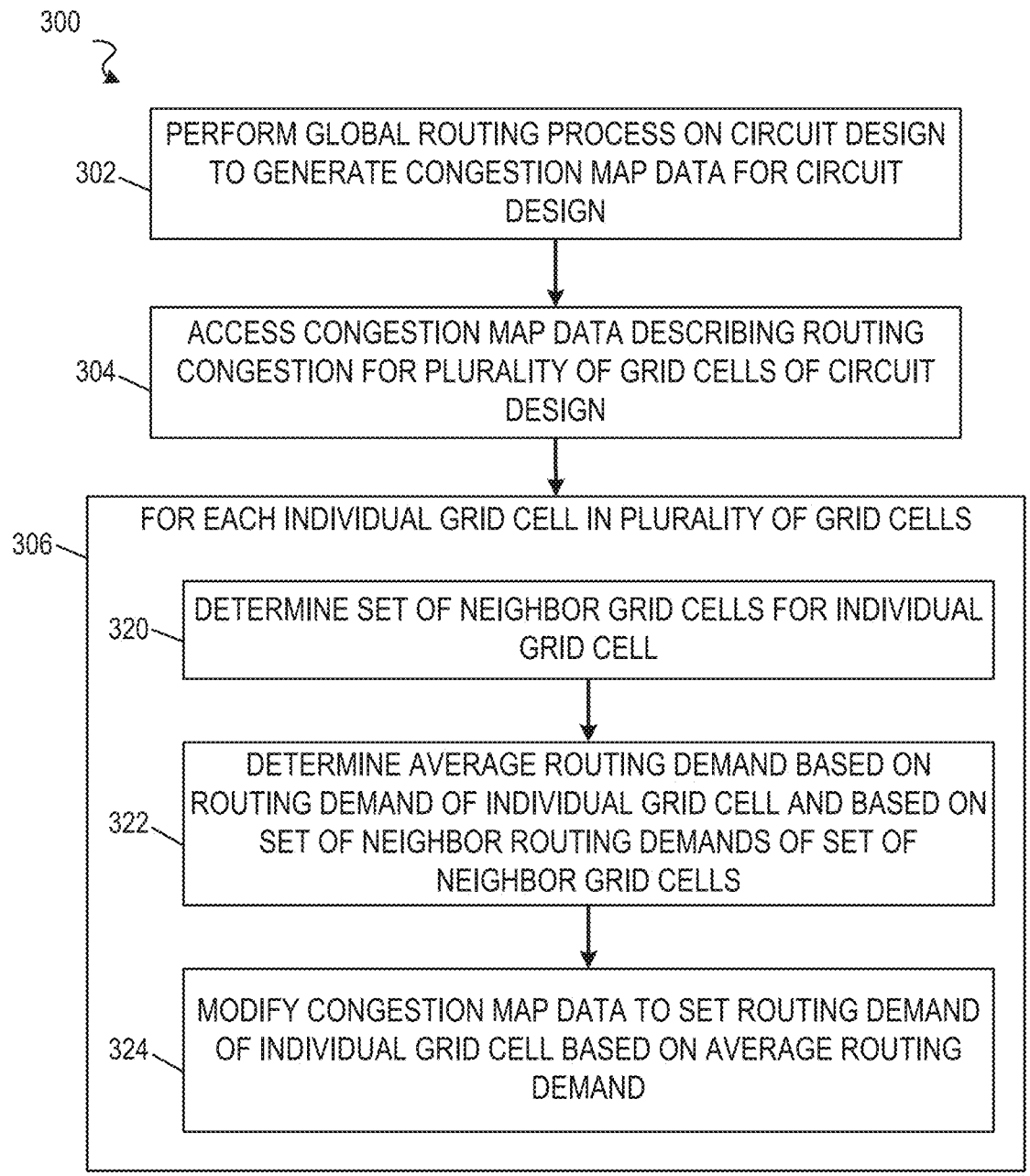
Figure 4:
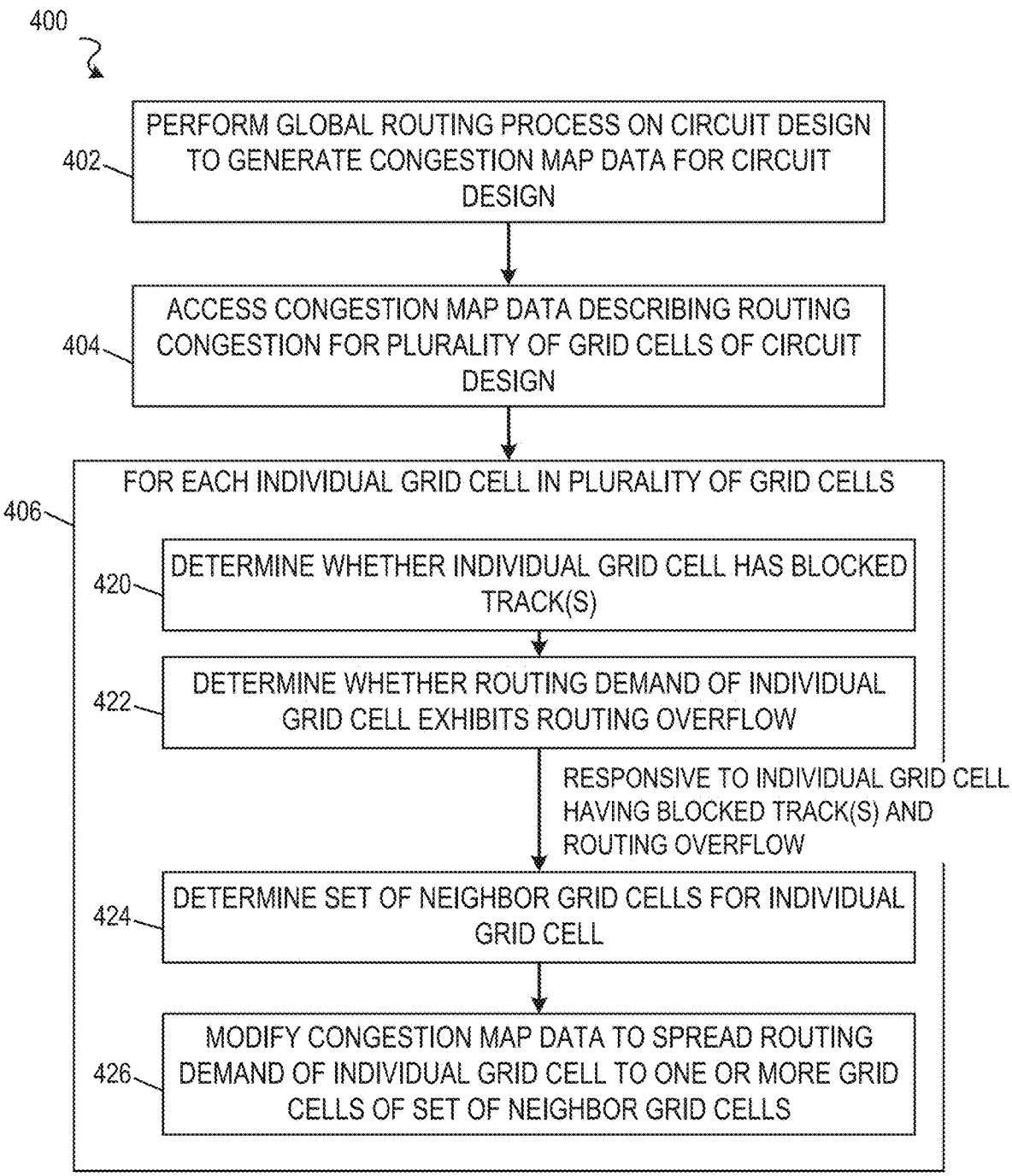

FIGS. 2 through 4 are flowcharts illustrating example methods for adjusting routing demand of one or more grid cells of a circuit design, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For example, the operations of a method 200 of FIG. 2 can be represented by executable instructions that, when executed by a hardware processor of a computing device, cause the computing device to perform the method 200. An operation of a method described herein can be performed by a hardware processor (e.g., central processing unit or graphics processing unit) of a computing device (e.g., desktop, server, etc.).

Depending on the embodiment, an operation of an example method described herein may be repeated in different ways or involve intervening operations not shown.

Though the operations of example methods may be depicted and described in a certain order, the order in which the operations are performed may vary among embodiments, including performing certain operations in parallel.

Referring now to FIG. 2, the flowchart illustrates the example method 200 for routing a circuit design based on adjusting routing demand of one or more grid cells of the circuit design, according to some embodiments. As shown, at operation 202, a global routing process is performed on a circuit design (described by circuit design data), where the global routing process generates congestion map data (describing a congestion map) for the circuit design. For various embodiments, the congestion map data describes routing congestion for a plurality of grid cells of the circuit design. After generation of the congestion map data (by operation 202), at operation 204, routing demand smoothing is performed on the congestion map data as described herein. For instance, depending on the embodiment, operation 204 can be performed in accordance with some or all of a method 300 of FIG. 3, a method 500 of FIG. 5, a method 700 of FIG. 7, or some combination thereof. As shown, at operation 206, routing demand spreading is performed on the congestion map data as described herein. For instance, depending on the embodiment, operation 206 can be performed in accordance with some or all of a method 400 of FIG. 4, a method 900 of FIG. 9, or some combination thereof.

The result of performing operation 204, operation 206, or both results in a modified version of the congestion map data (modified congestion map data) that describes a modified congestion map) for the circuit design. For some embodiments, operation 204 results in a modified version of the congestion map data, and operation 206 is performed based on the modified version of the congestion map data. The modified congestion map data represents the congestion map data generated by operation 202 after one or more bumps of the congestion map data have been smoothed (e.g., removed). Based on the modified congestion map data, at operation 208, a detailed routing process (e.g., that is part of an EDA tool) is performed for the circuit design, which can result in improved detailed-routed circuit design as described herein.

Referring now to FIG. 3, the flowchart illustrates the example method 300 for adjusting routing demand of one or more grid cells of a circuit design by routing demand smoothing, according to some embodiments. At operation 302, a global routing process is performed on a circuit design (e.g., described by circuit design data) to generate a congestion map data for the circuit design, where the congestion map data describes routing congestion for a plurality of grid cells of the circuit design. For some embodiments, the plurality of grid cells (of the circuit design) comprises grid cells for one or more layers of the circuit design (e.g., where each layer has its own set of grid cells). Subsequently, at operation 304, the congestion map data generated by operation 302 is accessed.

Figure 6:
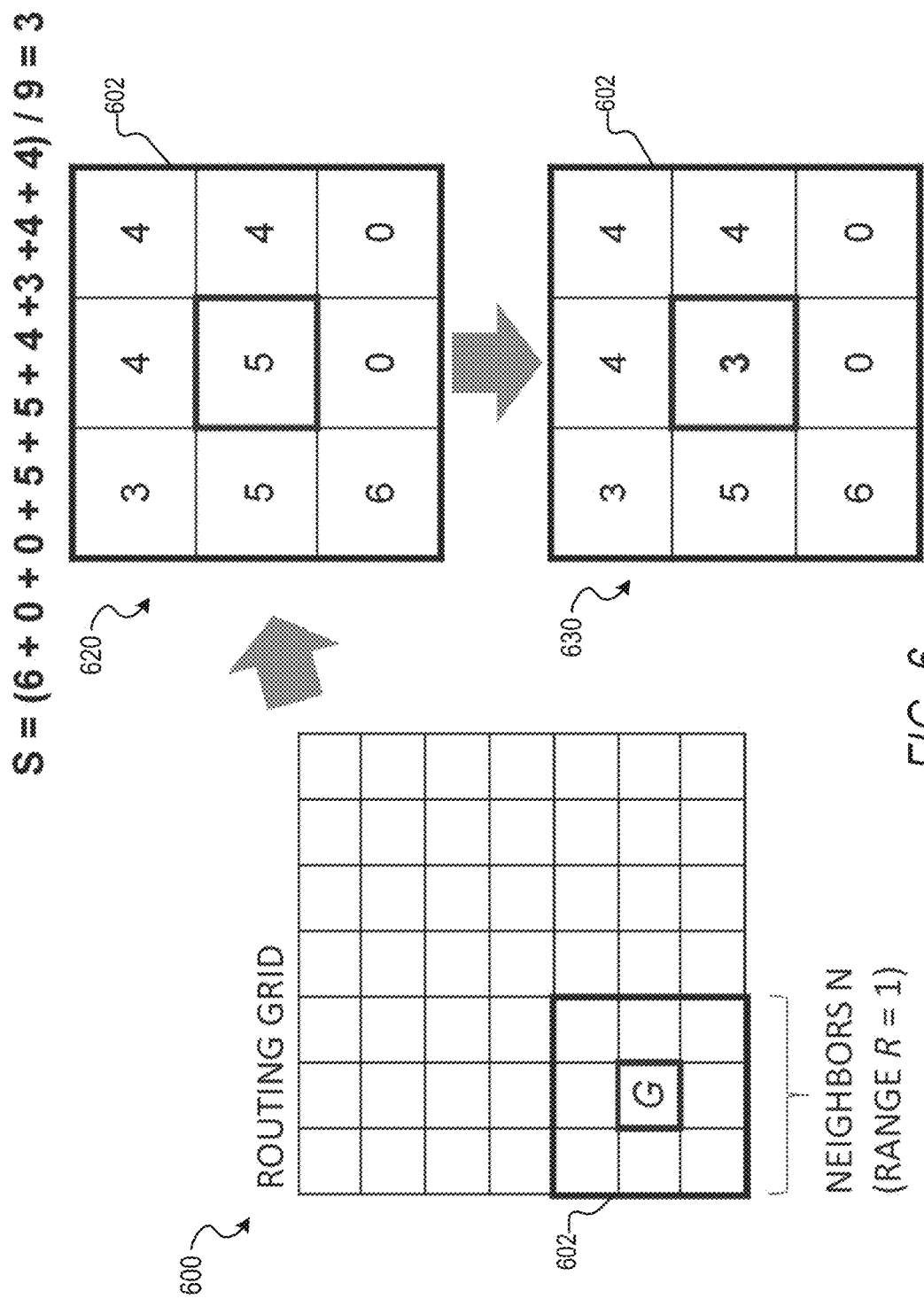
FIG. 6 is diagram illustrating an example of a method for routing demand smoothing being performed, according to some embodiments.

Eventually, the method 300 proceeds to operation 306, where operations 320, 322, and 324 are performed with respect to each individual grid cell in the plurality of grid cells (of the circuit design) described by the congestion map data generated by operation 302 (and accessed by operation 304). Operation 320 determines (e.g., identifies) a set of neighbor grid cells, from the plurality of grid cells, that are in proximity to (e.g., neighboring) the individual grid cell within a range. Depending on the embodiment, the range (e.g., range value) can be defined in terms of number of grid cells. For instance, the range can be set to a value of 1 to represent a range of one grid cell and, as a result, the determined set of neighbor grid cells comprises grid cells immediately adjacent to the individual cell (e.g., as illustrated in FIG. 6). In another instance, the range can be set to a value of 2 to represent a range of two grid cells and, as a result, the determined set of neighbor grid cells comprises a first set of grid cells immediately adjacent to the individual cell and a second set of grid cells that are adjacent to the first set of grid cells. For various embodiments, the range is a user-defined value, such as a value defined by a user of an EDA.

Figure 5:
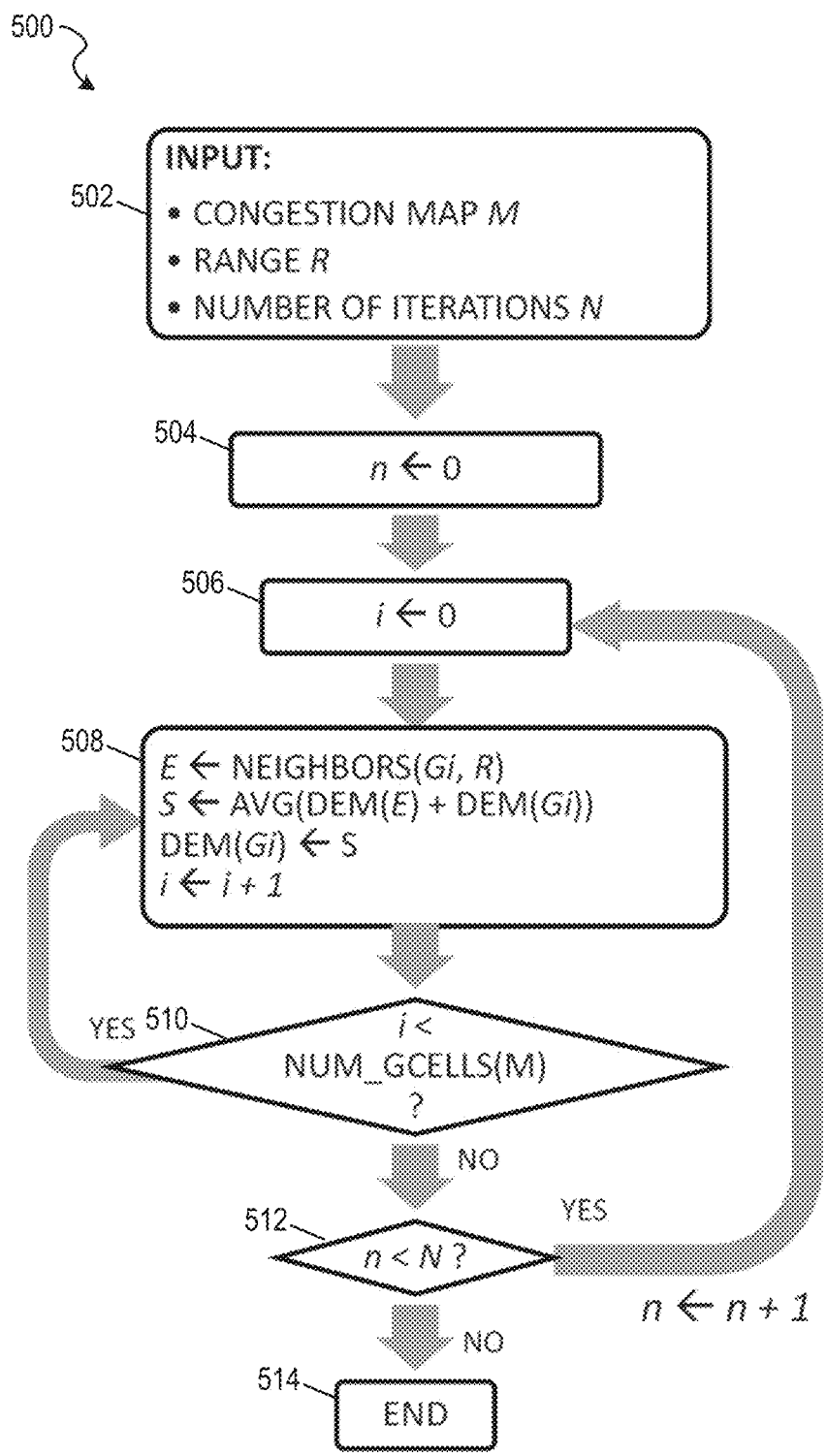
FIG. 5 is a flowchart illustrating an example method for routing demand smoothing, according to some embodiments.

Subsequently, at operation 322, an average routing demand is determined (e.g., calculated) for the individual grid cell based on a routing demand of the individual grid cell and based on a set of neighbor routing demands of (e.g., corresponding to) the set of neighbor grid cells. For some embodiments, the congestion map data describes the routing demand and the set of neighbor routing demands used by operation 322. Additionally, for some embodiments, the average routing demand is determined by determining (e.g., calculating) an average (e.g., an average value) of the routing demand (of the individual grid cell) and the set of neighbor routing demands. FIG. 5 illustrates an example of how some embodiments perform operation 322.

Alternatively, for some embodiments (though not illustrated), prior to (or as part of) determining the average routing demand at operation 322, a weight for the individual grid cell is determined based on a number of tracks of the individual grid cell, and the average routing demand is determined based on the individual routing demand, the set of neighbor routing demands, and the weight for the individual grid cell. For instance, the weight for the individual grid cell can be determined by dividing a number of tracks of the individual grid cell by an average number of tracks per grid cell for the plurality of grid cells. A set of weighted neighbor routing demands can be generated by applying (e.g., multiplying) each neighbor routing demand of the set of neighbor routing demands by the weight. The average of the routing demand (of the individual grid cell) can be determined by determining (e.g., calculating) an average (e.g., an average value) of the routing demand (of the individual grid cell) and the set of weighted neighbor routing demands. FIG. 6 illustrates an example of how some embodiments perform operation 322 using a weighted approach.

Eventually, operation 324 modifies the congestion map data (e.g., current version of the congestion map data) to set the routing demand of the individual grid cell based on the average routing demand determined by operation 322. For instance, operation 324 can comprise setting the routing demand of the individual grid cell based on the average routing demand determined by operation 322.

For some embodiments, after operation 306 has completed for each individual grid cell in the plurality of grid cells (of the circuit design), operation 306 can be repeated again for one or more additional iterations. Depending on the embodiment, the number of iterations that operation 306 is repeated is a user-defined value, such as value defined by a user of an EDA.

Referring now to FIG. 4, the flowchart illustrates the example method 400 for adjusting routing demand of one or more grid cells of a circuit design by routing demand spreading, according to some embodiments. As shown, the method 400 comprises operations 402 and 404, which according to some embodiments, are respectively similar to operations 302 and 304 described with respect to the method 300 of FIG. 3.

Eventually, the method 400 proceeds to operation 406, where operations 420, 422, 424, and 426 are performed with respect to each individual grid cell in the plurality of grid cells (of the circuit design) described by the congestion map data generated by operation 402 (and accessed by operation 404). Operation 420 determines whether the individual grid cell has at least one blocked track, and operation 422 determines, based on the congestion map data, whether the individual grid cell has a routing demand that indicates (e.g., exhibits) routing overflow. In response to the individual grid cell having at least one blocked track and having a routing demand that indicates (e.g., exhibits) routing overflow, operations 424 and 426 are performed. As shown operation 424 determines (e.g., identifies) a set of neighbor grid cells, from the plurality of grid cells, that do not have any blocked tracks, that are in proximity to (e.g., neighboring) the individual grid cell within a range, and that satisfy a routing underflow condition. For some embodiments, the routing underflow condition is satisfied by a neighbor grid cell when an associated routing demand of the neighbor grid cell is less than an associated routing capacity of the neighbor grid cell minus one. Additionally, depending on the embodiment, the range (e.g., range value) can be defined in terms of number of grid cells. For instance, the range can be set to a value of 1 to represent a range of one grid cell and, as a result, the determined set of neighbor grid cells comprises grid cells immediately adjacent to the individual cell (e.g., as illustrated in FIG. 6). In another instance, the range can be set to a value of 2 to represent a range of two grid cells and, as a result, the determined set of neighbor grid cells comprises a first set of grid cells immediately adjacent to the individual cell and a second set of grid cells that are adjacent to the first set of grid cells. For various embodiments, the range is a user-defined value, such as a value defined by a user of an EDA. For some embodiment, the range value used by operation 424 is similar to the range value used by operation 320 of the method 300 of FIG. 3.

At operation 426, the congestion map data is modified to spread the routing demand of the individual grid cell to one or more grid cells of the individual set of neighbor grid cells. For some embodiments, operation 426 comprises transferring at least some portion of the routing demand (of the individual grid cell) to an associated routing demand of a neighbor grid cell, in the select set of neighbor grid cells, where the transfer can be based on (e.g., conditioned on) a routing capacity of the individual grid cell and a routing capacity of the neighbor grid cell.

FIG. 5 is a flowchart illustrating an example method for routing demand smoothing, according to some embodiments. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. For some embodiments, the method 500 represents an example of performing operation 204 of the method 200 of FIG. 2.

Referring now to FIG. 5, operation 502 receives as input a congestion map M (e.g., congestion map data M), a range R (e.g., range value R), and a (total) number of iterations N. For some embodiments, the congestion map M4 describes a plurality of grid cells of a circuit design. Additionally, for some embodiments, either the range R, the total number of iterations N, or both are user-defined values. To initialize the method 500, operation 504 sets a current iteration number n to 0, and operation 506 sets a current element number i to 0. Operation 508 determines a set of neighbor grid cells E for an i-th grid cell Gi (from the plurality of grid cells described by congestion map data M) within a range R of the i-th grid cell Gi. Operation 508 determines an average routing demand S of routing demand of i-th grid cell Gi (represented DEM(Gi)) and routing demand of each grid cell in the set of neighbor grid cells E (represented by DEM(E)). Then, operation 508 sets the routing demand of i-th grid cell Gi (represented DEM(Gi)) equal to the average routing demand S. Eventually, operation 508 increases the current element number i by one.

From operation 508, the method 500 proceeds to operation 510, where it is determined whether the current element number i is less than the total number of grid cells in the plurality of grid cells described by the congestion map M (NUM_GCELLS(M)). If yes, the method 500 returns to operation 508 to be performed with respect to the current i-th grid cell Gi, otherwise the method 500 proceeds to operation 512. At operation 512, it is determined whether the current iteration number n is less than the total number of iterations. If yes, the current iteration number n is incremented by one, and the method 500 returns to operation 506. If no, the method 500 ends at operation 514. By way of operation 512, various embodiments can repeat the routing demand smoothing process over all grid cells described by the congestion map M, for multiple iterations N, in an attempt to reduce or remove the bumpiness of the congestion map M to a desired level.

FIG. 6 is a diagram illustrating an example of the method 500 being performed, according to some embodiments. In FIG. 6, a routing grid 600 is illustrated with an individual grid cell G with neighbor grid cells N within a range 602 equal to one grid cell. At 620, the routing demands of the neighbor grid cells and the individual grid cell G (e.g., as described by a congestion map for a circuit design) are illustrated. The routing demands illustrated at 620 represent the routing demands prior to routing demand smoothing being performed by the method 500 of FIG. 5 as described herein. As shown, the method 500 would calculate the average routing demand S of the routing demand of the individual grid cell G (5) and each of the routing demands of the neighbor grid cells (3, 4, 4, 5, 4, 6, 0, 0) to be equal to 3. Based on this average routing demand, the method 500 sets (e.g., adjusts) the routing demand of the individual grid cell G to be 3, as illustrated at 630.

Figure 7:
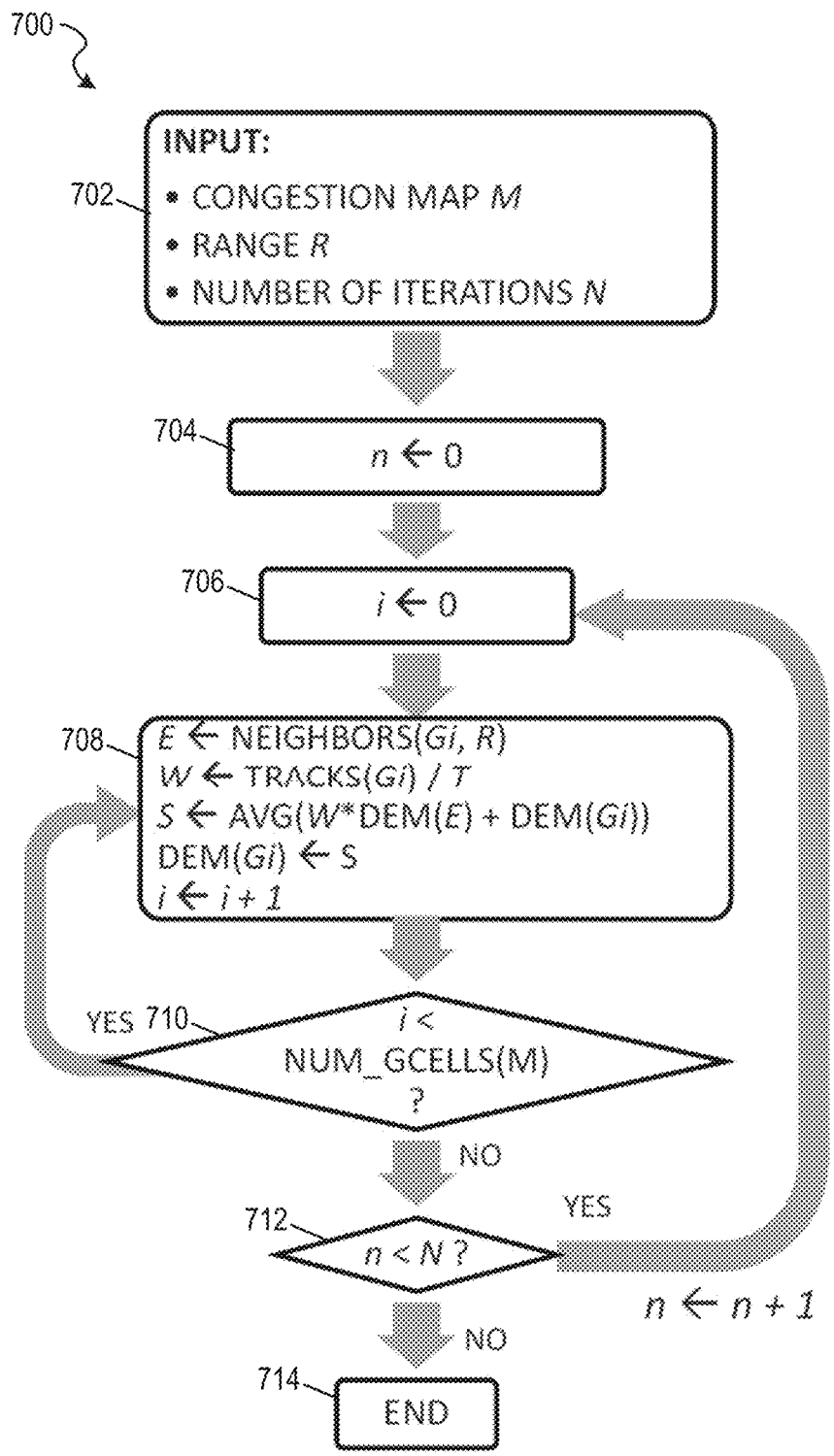
FIG. 7 is a flowchart illustrating example method for routing demand smoothing, according to some embodiments.

FIG. 7 is a flowchart illustrating an example method for routing demand smoothing, according to some embodiments. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. For some embodiments, the method 700 represents an example of performing operation 204 of the method 200 of FIG. 2.

Referring now to FIG. 7, operation 702, 704, 706, 710, 712, and 714 are similar to operations 502, 504, 506, 510, 512, and 514 of the method 500. Operation 708 determines a set of neighbor grid cells E for i-th grid cell Gi (from the plurality of grid cells described by congestion map data M) within a range R of the i-th grid cell Gi. Operation 708 determines a weight W for the for i-th grid cell Gi by dividing a number of tracks of the i-th grid cell Gi (TRACKS(Gi)) by the average number of track per a grid cell T in the congestion map M. Then, operation 708 determines an average routing demand S of routing demand of i-th grid cell Gi (represented DEM(Gi)) and weighted-routing demand of each grid cell in the set of neighbor grid cells E (represented by W*DEM(E)), where the weighted-routing demand of each grid cell (in the set of neighbor grid cells E) is determined by multiplying the weight W to each of the routing demands of each grid cell in the set of neighbor grid cells E. Then, operation 708 sets the routing demand of i-th grid cell Gi (represented DEM(Gi)) equal to the average routing demand S. Eventually, operation 708 increases the current element number i by one.

Figure 8:
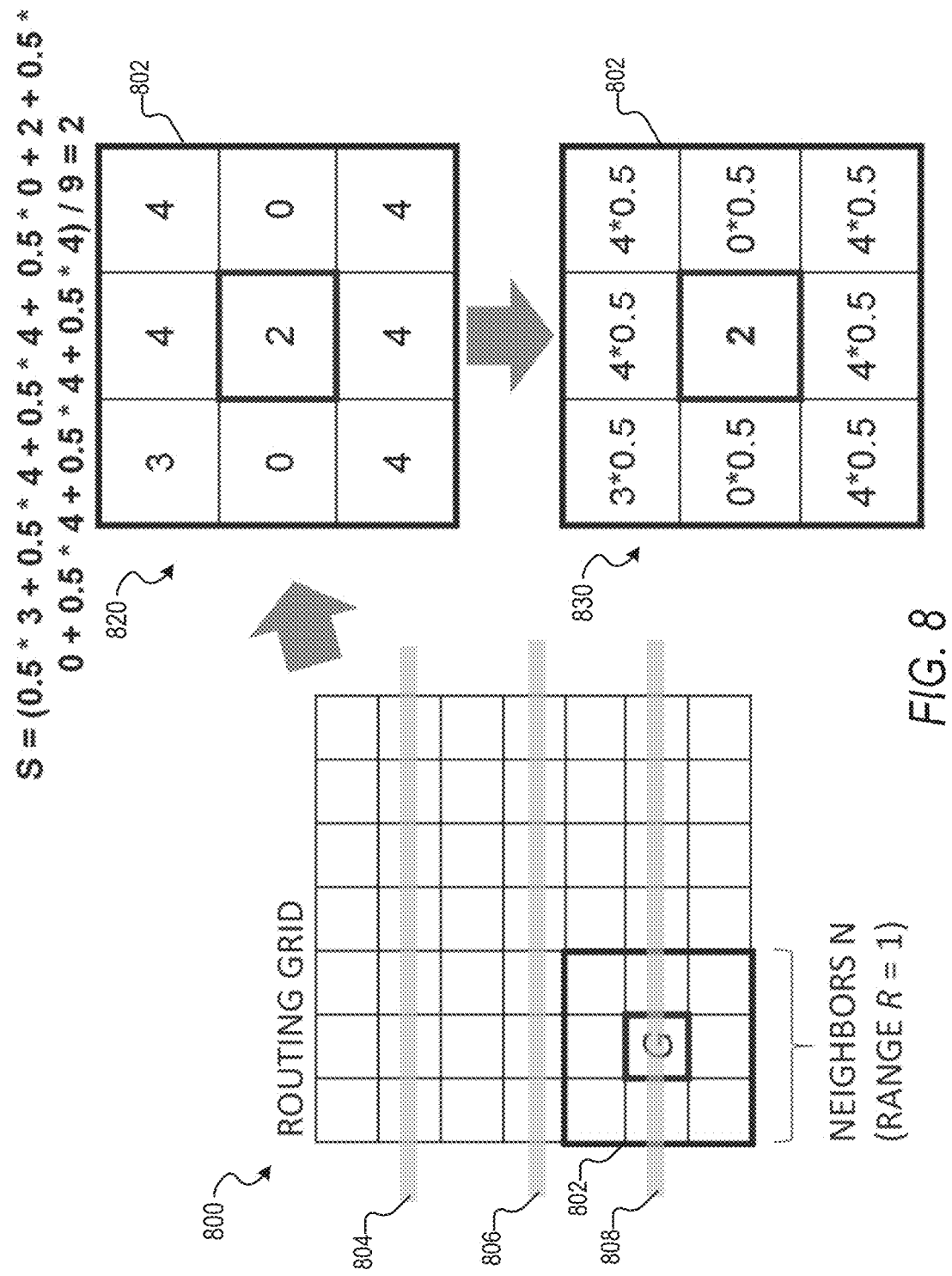
FIG. 8 is diagram illustrating an example of a method for routing demand smoothing being performed, according to some embodiments.

FIG. 8 is a diagram illustrating an example of the method 700 being performed, according to some embodiments. In FIG. 8, a routing grid 800 is illustrated with an individual grid cell G with neighbor grid cells N within a range 802 equal to one grid cell, and is also illustrated with blocked tracks 804, 806, 808. At 820, the routing demands of the neighbor grid cells and the individual grid cell G (e.g., as described by a congestion map for a circuit design) are illustrated. The routing demands illustrated at 820 represent the routing demands prior to routing demand smoothing being performed by the method 700 of FIG. 7 as described herein. For FIG. 8, the method 700 would determine a weight of 0.5, and calculate the average routing demand S of the routing demand of the individual grid cell G (2) and each of the weighted routing demands of the neighbor grid cells (0.5*3, 0.5*4, 0.5*4, 0.5*0, 0.5*0, 0.5*4, 0.5*4, 0.5*4) to be equal to 2. Based on this average routing demand, the method 700 sets (e.g., adjusts) the routing demand of the individual grid cell G to be 2, as illustrated at 830.

Figure 9:
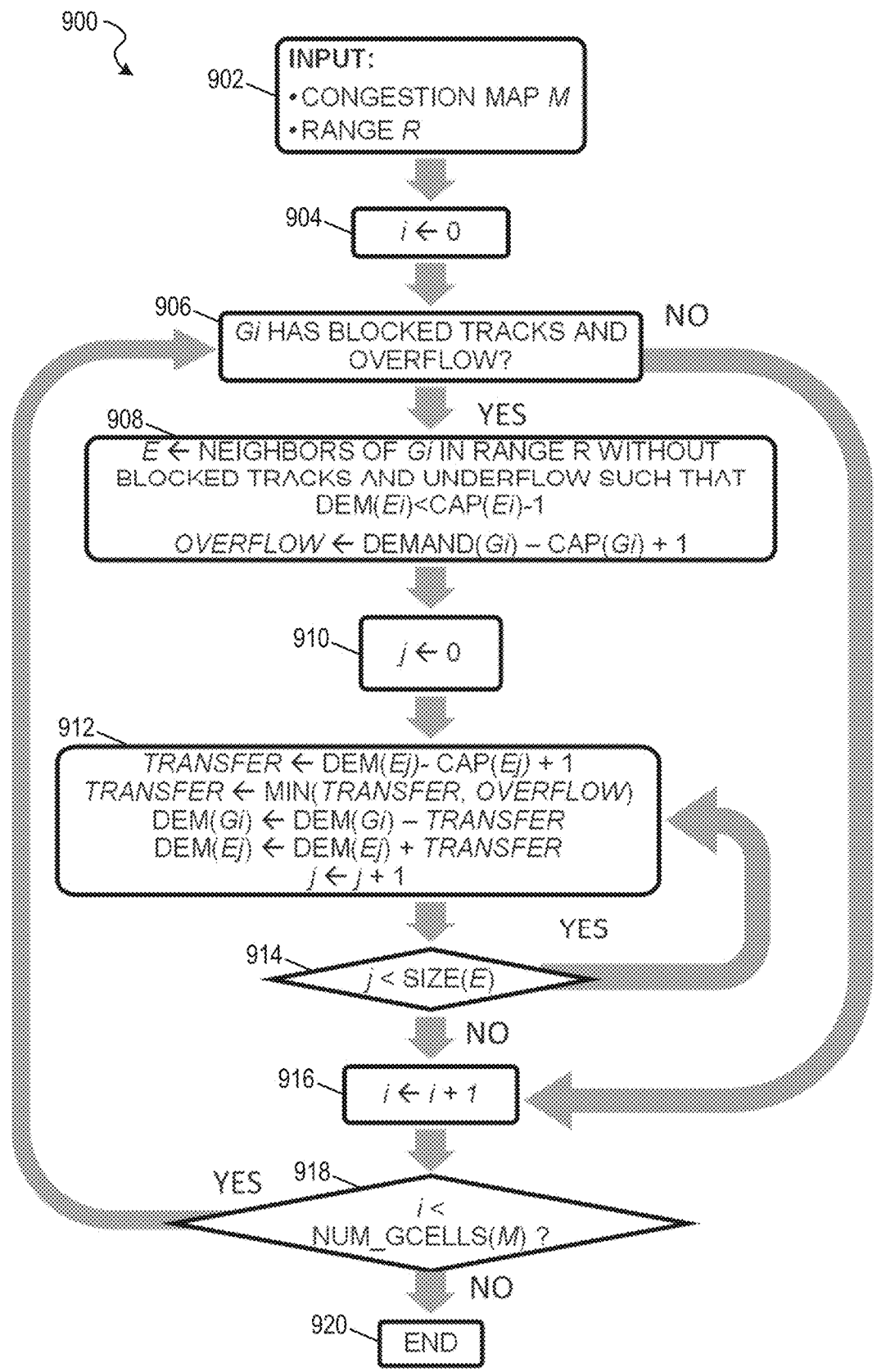
FIG. 9 is a flowchart illustrating example method for routing demand spreading, according to some embodiments.

FIG. 9 is a flowchart illustrating an example method for routing demand spreading, according to some embodiments. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. For some embodiments, the method 900 represents an example of performing operation 206 of the method 200 of FIG. 2.

Referring now to FIG. 9, operation 902 receives as input a congestion map M (e.g., congestion map data M), and a range R (e.g., range value R). For some embodiments, the congestion map M describes a plurality of grid cells of a circuit design. Additionally, for some embodiments, the range R is a user-defined value. To initialize the method 900, operation 904 sets a current element number i to 0. Subsequently, operation 906 determines whether an i-th grid cell Gi (from the plurality of grid cells described by congestion map data M) has one or more blocked tracks and has a routing demand that indicates the i-th grid cell Gi has routing overflow. If the i-th grid cell Gi has both, the method 900 proceeds to operation 908, otherwise the method 900 proceeds to operation 916.

Operation 908 determines a set of neighbor grid cells E for an i-th grid cell Gi (from the plurality of grid cells described by congestion map data M), where each neighbor grid cell is within a range R of the i-th grid cell Gi, does not have any blocked tracks, and has routing underflow such that a routing demand of the neighbor grid cell E (represented by DEM(E)) is less than a routing capacity of the neighbor grid cell E (represented by CAP(E)) minus one. Additionally, operation 908 sets an overflow value OVERFLOW to a routing demand of the i-th grid cell Gi(represented DEM (Gi)) minus a routing capacity of the i-th grid cell Gi (represented by CAP(Gi)) plus one.

Subsequently, operation 910 sets a current element number j to 0 and, by operation 912, begins transferring at some portion of the routing demand of the i-th grid cell Gi (DEM(Gi)) to one or more neighbor grid cells in the set of neighbor grid cells E. Specifically, operation 912 sets a transfer value TRANSFER to a routing demand of a j-th neighbor grid cell Ej (in the set of neighbor grid cells E) (represented by DEM(Ej)) minus a routing capacity of a j-th neighbor grid cell Ej (represented by CAP(Ej)) plus one. Operation 912 then sets the transfer value TRANSFER to the minimum of the transfer value TRANSFER or the overflow value OVERFLOW set by operation 908. Thereafter, based on the transfer value TRANSFER, operation 912 sets the routing demand of the i-th grid cell Gi (DEM(Gi)) to the routing demand of the i-th grid cell Gi (DEM(Gi)) minus the transfer value TRANSFER. Additionally, operation 912 sets the routing demand of the j-th neighbor grid cell Ej (DEM(E j)) to the routing demand of the j-th neighbor grid cell Ej(DEM(Ej)) plus the transfer value TRANSFER. Operation 912 also increases the current element number j by one. The method 900 then proceeds to operation 914, where it is determined whether the current element number j is less than the size of the set of neighbor grid cells (represented by SIZE(E)). If yes, the method 900 proceeds to operation 912, otherwise the method 900 proceeds to operation 916.

At operation 916, the current element number i is increased by one, and the method 900 proceeds to operation 918. Operation 918 determines whether the current element number i is less than the total number of grid cells in the plurality of grid cells described by the congestion map M (NUM_GCELLS(M)). If yes, the method 900 returns to operation 906 to be performed with respect to the current i-th grid cell Gi, otherwise the method 900 proceeds to operation 920, where the method 900 ends.

Figure 10:
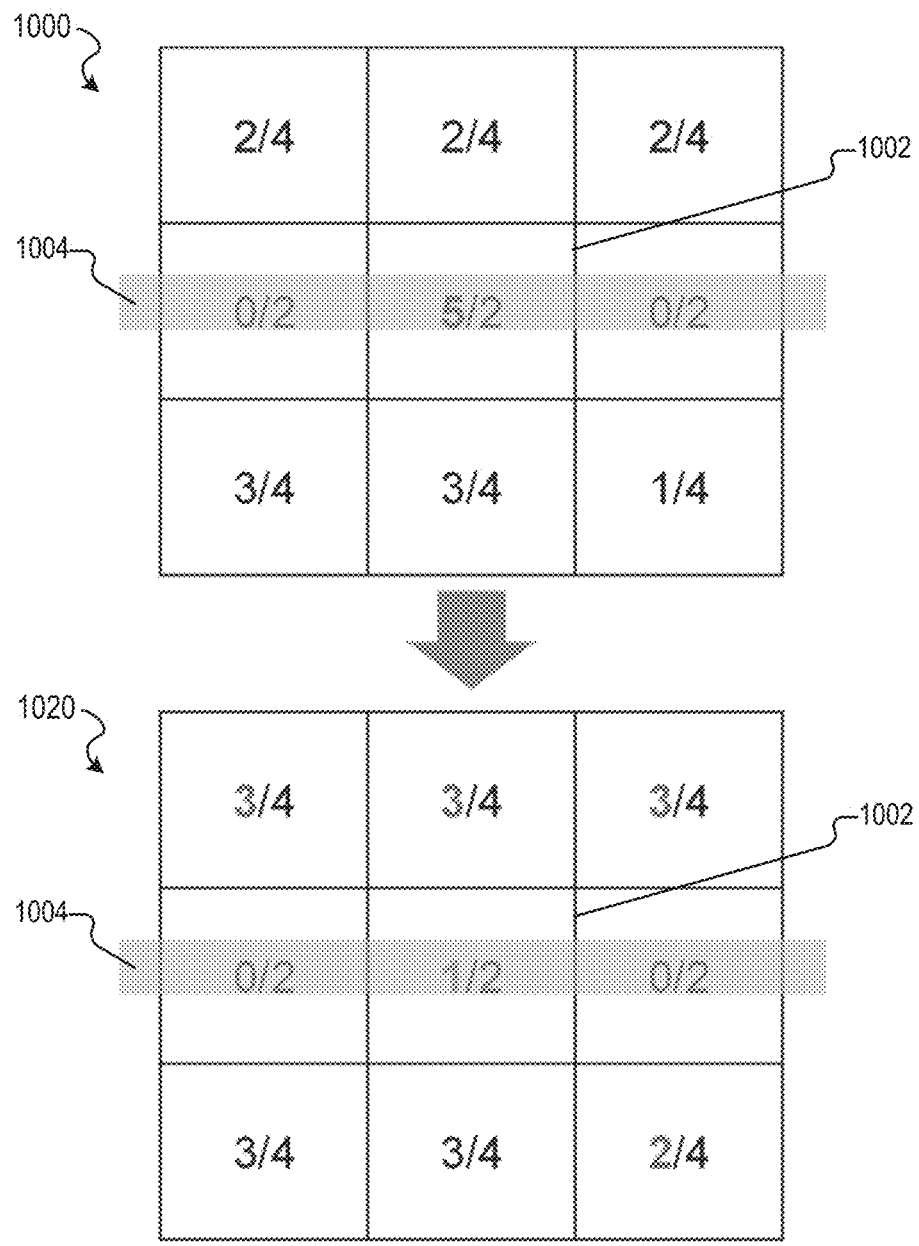
FIG. 10 is diagram illustrating an example of a method for routing demand spreading being performed, according to some embodiments.

FIG. 10 is a diagram illustrating an example of the method 900 being performed, according to some embodiments. In FIG. 10, a routing grid is illustrated with an individual grid cell 1002, neighbor grid cells around the individual grid cell 1002, and blocked track 1004 passing through the individual grid cell 1002. At 1000, each of the grid cells is illustrated with its routing demand over its routing capacity. The routing demands illustrated at 1000 represent the routing demands prior to routing demand spreading being performed by the method 900 of FIG. 9 as described herein. The individual grid cell 1002 has a routing demand over routing capacity of 5/2. At 1020, the routing demands illustrated represent a routing demand of 5 (e.g., routing overflow of 5/2) of the individual grid cell 1002 being spread (e.g., transferred) to at least some of the neighbor grid cells by the method 900, thereby reducing the routing demand (and routing overflow) of the individual grid cell 1002.

Figure 11:
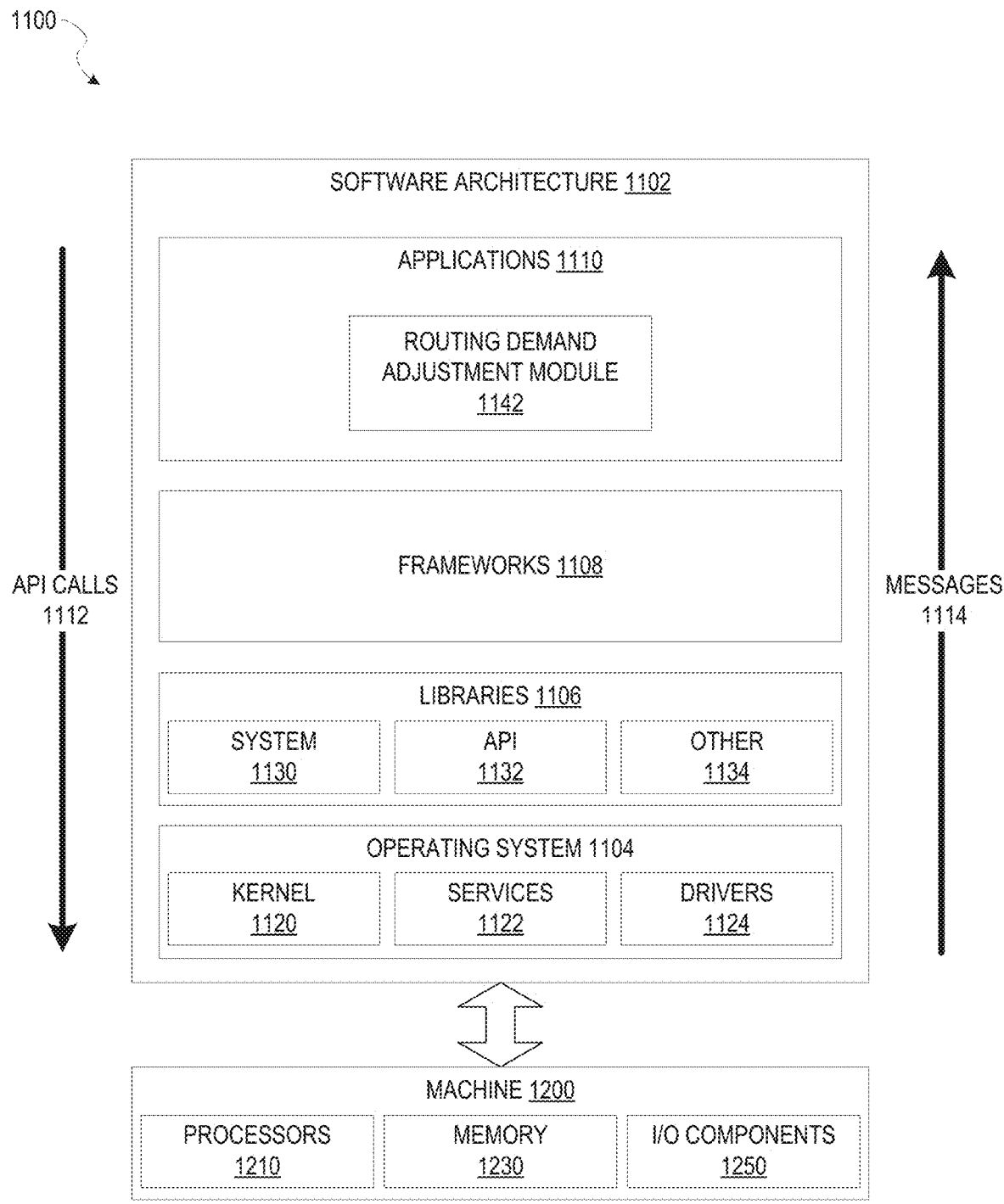
FIG. 11 is a block diagram illustrating an example of a software architecture that may be operating on an electronic design automation (EDA) computing device and may be used with methods for adjusting routing demand of one or more grid cells of a circuit design, according to some embodiments.

FIG. 11 is a block diagram 1100 illustrating an example of a software architecture 1102 that may be operating on an EDA computer and may be used with methods for adjusting routing demand of one or more grid cells of a circuit design (e.g., by either routing demand smoothing or routing demand spreading), according to some example embodiments. The software architecture 1102 can be used as an EDA computing device to implement any of the methods described above. Aspects of the software architecture 1102 may, in various embodiments, be used to store circuit designs, and to route a circuit design based on adjusting a routing demand in an EDA environment to generate circuit designs, from which physical devices may be generated.

FIG. 11 is merely a non-limiting example of a software architecture 1102, and it will be appreciated that many other architectures can be implemented to facilitate the functionality described herein. In various embodiments, the software architecture 1102 is implemented by hardware such as a machine 1200 of FIG. 12 that includes processors 1210, memory 1230, and I/O components 1250. In this example, the software architecture 1102 can be conceptualized as a stack of layers where each layer may provide a particular functionality. For example, the software architecture 1102 includes layers such as an operating system 1104, libraries 1106, software frameworks 1108, and applications 1110. Operationally, the applications 1110 invoke application programming interface (API) calls 1112 through the software stack and receive messages 1114 in response to the API calls 1112, consistent with some embodiments. In various embodiments, any client device, any server computer of a server system, or any other device described herein may operate using elements of the software architecture 1102. An EDA computing device described herein may additionally be implemented using aspects of the software architecture 1102, with the software architecture 1102 adapted for operating to perform routing a net of a circuit design in any manner described herein.

In one embodiment, an EDA application of the applications 1110 performs circuit design routing using routing demand adjustment according to embodiments described herein using various modules within the software architecture 1102. For example, in one embodiment, an EDA computing device similar to the machine 1200 includes the memory 1230 and the one or more processors 1210. The processors 1210 also implement a routing demand adjustment module 1142 for adjusting a routing demand of a grid cell of a circuit design in accordance with various embodiments described herein.

In various other embodiments, rather than being implemented as modules of the one or more applications 1110, the routing demand adjustment module 1142 may be implemented using elements of the libraries 1106, the operating system 1104, or the software frameworks 1108.

In various implementations, the operating system 1104 manages hardware resources and provides common services. The operating system 1104 includes, for example, a kernel 1120, services 1122, and drivers 1124. The kernel 1120 acts as an abstraction layer between the hardware and the other software layers, consistent with some embodiments. For example, the kernel 1120 provides memory management, processor management (e.g., scheduling), component management, networking, and security settings, among other functionalities. The services 1122 can provide other common services for the other software layers. The drivers 1124 are responsible for controlling or interfacing with the underlying hardware, according to some embodiments. For instance, the drivers 1124 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1106 provide a low-level common infrastructure utilized by the applications 1110. The libraries 1106 can include system libraries 1130 such as libraries of blocks for use in an EDA environment or other libraries that can provide functions such as memory allocation functions, string manipulation functions, mathematic functions, and the like. In addition, the libraries 1106 can include API libraries 1132 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 1106 may also include other libraries 1134.

The software frameworks 1108 provide a high-level common infrastructure that can be utilized by the applications 1110, according to some embodiments. For example, the software frameworks 1108 provide various graphic user interface (GUI) functions, high-level resource management, high-level location services, and so forth. The software frameworks 1108 can provide a broad spectrum of other APIs that can be utilized by the applications 1110, some of which may be specific to a particular operating system 1104 or platform. In various embodiments, the systems, methods, devices, and instructions described herein may use various files, macros, libraries, and other elements of an EDA design environment to implement routing demand adjustment as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1102, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. The methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1200 including processors 1210), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 1200, but deployed across a number of machines 1200. In some example embodiments, the processors 1210 or processor-implemented modules are located in a single geographic location (e.g., within a home environment, an office environment, or a server farm). In other example embodiments, the processors or processor-implemented modules are distributed across a number of geographic locations.

Figure 12:
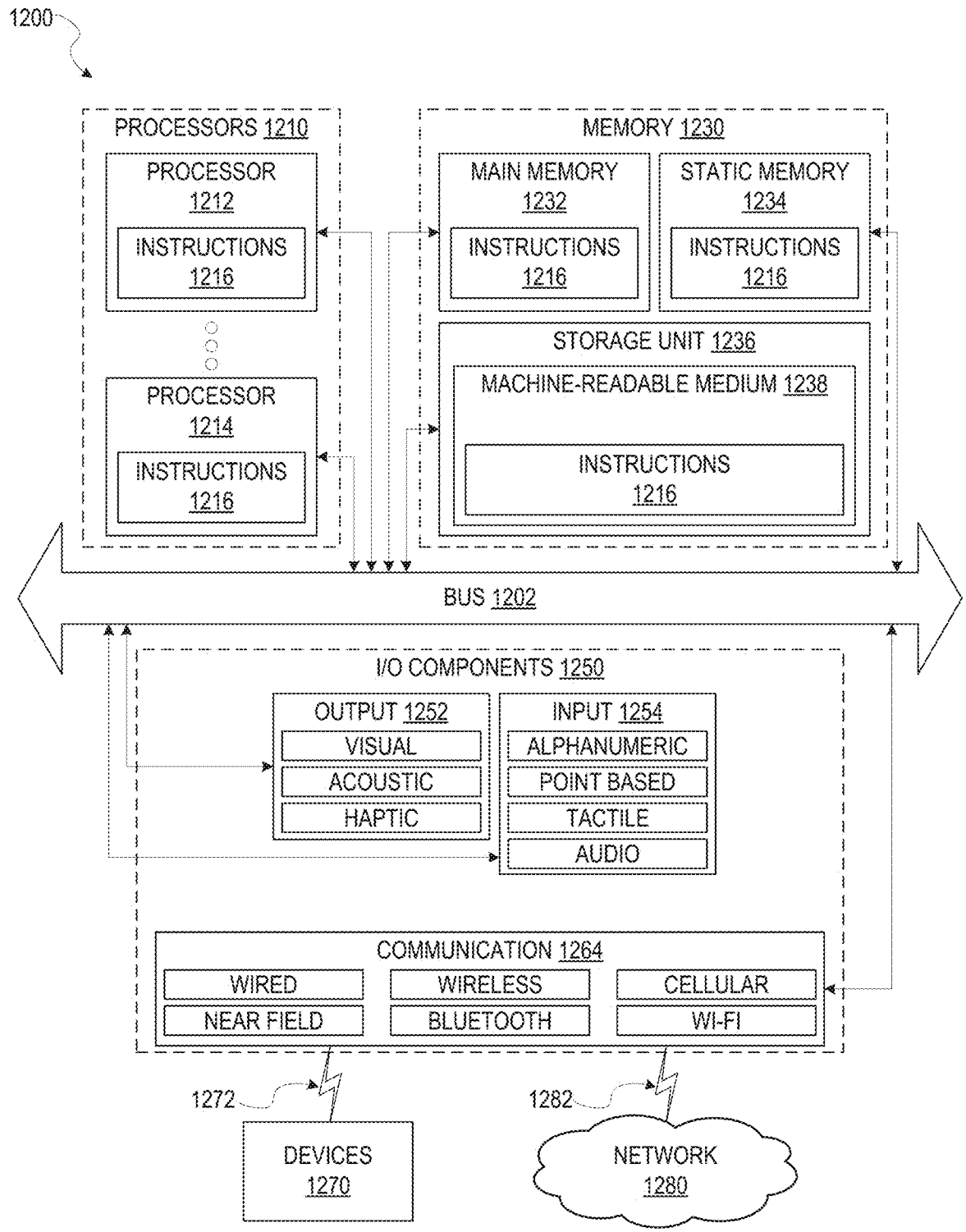
FIG. 12 is a diagram representing a machine in the form of a computer system within which a set of instructions are executed, causing the machine to perform any one or more of the methods discussed herein, according to some embodiments.

FIG. 12 is a diagrammatic representation of the machine 1200 in the form of a computer system within which a set of instructions may be executed for causing the machine 1200 to perform any one or more of the methodologies discussed herein, according to an example embodiment. FIG. 12 shows components of the machine 1200, which is, according to some embodiments, able to read instructions from a machine-readable medium (e.g., a machine-readable storage medium) and perform any one or more of the methodologies discussed herein. Specifically, FIG. 12 shows a diagrammatic representation of the machine 1200 in the example form of a computer system, within which instructions 1216 (e.g., software, a program, an application, an applet, an app, or other executable code) for causing the machine 1200 to perform any one or more of the methodologies discussed herein can be executed. In alternative embodiments, the machine 1200 operates as a standalone device or can be coupled (e.g., networked) to other machines. In a networked deployment, the machine 1200 may operate in the capacity of a server machine or a client machine in a server-client network environment, or as a peer machine in a peer-to-peer (or distributed) network environment. The machine 1200 can comprise, but not be limited to, a server computer, a client computer, a personal computer (PC), a tablet computer, a laptop computer, a netbook, or any machine capable of executing the instructions 1216, sequentially or otherwise, that specify actions to be taken by the machine 1200. Further, while only a single machine 1200 is illustrated, the term "machine" shall also be taken to include a collection of machines 1200 that individually or jointly execute the instructions 1216 to perform any one or more of the methodologies discussed herein.

In various embodiments, the machine 1200 comprises processors 1210, memory 1230, and I/O components 1250, which can be configured to communicate with each other via a bus 1202. In an example embodiment, the processors 1210 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1212 and a processor 1214 that may execute the instructions 1216. The term "processor" is intended to include multi-core processors 1210 that may comprise two or more independent processors 1212, 1214 (also referred to as "cores") that can execute the instructions 1216 contemporaneously. Although FIG. 12 shows multiple processors 1210, the machine 1200 may include a single processor 1212 with a single core, a single processor 1212 with multiple cores (e.g., a multi-core processor 1212), multiple processors 1210 with a single core, multiple processors 1210 with multiple cores, or any combination thereof.

The memory 1230 comprises a main memory 1232, a static memory 1234, and a storage unit 1236 accessible to the processors 1210 via the bus 1202, according to some embodiments. The storage unit 1236 can include a machine-readable medium 1238 on which are stored the instructions 1216 embodying any one or more of the methodologies or functions described herein. The instructions 1216 can also reside, completely or at least partially, within the main memory 1232, within the static memory 1234, within at least one of the processors 1210 (e.g., within the processor's cache memory), or any suitable combination thereof, during execution thereof by the machine 1200. Accordingly, in various embodiments, the main memory 1232, the static memory 1234, and the processors 1210 are considered machine-readable media 1238.

As used herein, the term "memory" refers to a machine-readable medium 1238 able to store data temporarily or permanently and may be taken to include, but not be limited to, random-access memory (RAM), read-only memory (ROM), buffer memory, flash memory, and cache memory. While the machine-readable medium 1238 is shown, in an example embodiment, to be a single medium, the term "machine-readable medium" should be taken to include a single medium or multiple media (e.g., a centralized or distributed database, or associated caches and servers) able to store the instructions 1216. The term "machine-readable medium" shall also be taken to include any medium, or combination of multiple media, that is capable of storing instructions (e.g., the instructions 1216) for execution by a machine (e.g., the machine 1200), such that the instructions, when executed by one or more processors of the machine (e.g., the processors 1210), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1250 include a wide variety of components to receive input, provide output, produce output, transmit information, exchange information, capture measurements, and so on. In general, it will be appreciated that the I/O components 1250 can include many other components that are not shown in FIG. 12. The I/O components 1250 are grouped according to functionality merely for simplifying the following discussion, and the grouping is in no way limiting. In various example embodiments, the I/O components 1250 include output components 1252 and input components 1254. The output components 1252 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1254 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1250 may include communication components 1264 operable to couple the machine 1200 to a network 1280 or devices 1270 via a coupling 1282 and a coupling 1272, respectively. For example, the communication components 1264 include a network interface component or another suitable device to interface with the network 1280. In further examples, the communication components 1264 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1270 may be another machine or any of a wide variety of peripheral devices (e.g., a peripheral device coupled via a USB).

In various example embodiments, one or more portions of the network 1280 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1280 or a portion of the network 1280 may include a wireless or cellular network, and the coupling 1282 may be a Code Division Multiple Access (CDMA) connection, a Global System for Mobile communications (GSM) connection, or another type of cellular or wireless coupling.

Furthermore, the machine-readable medium 1238 is non-transitory (in other words, not having any transitory signals) in that it does not embody a propagating signal. However, labeling the machine-readable medium 1238 "non-transitory" should not be construed to mean that the machine-readable medium 1238 is incapable of movement; the machine-readable medium 1238 should be considered as being transportable from one physical location to another. Additionally, since the machine-readable medium 1238 is tangible, the machine-readable medium 1238 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated.

Structures and functionality presented as separate components in example configurations may be implemented as a combined structure or component.

Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:
    performing a global routing process on a circuit design to generate congestion map data for the circuit design, the congestion map data describing routing congestion for a plurality of grid cells of the circuit design; and
    for each individual grid cell in the plurality of grid cells:
        determining, from the plurality of grid cells, an individual set of neighbor grid cells that are in proximity to the individual grid cell within an individual range;
        determining an average routing demand based on an individual routing demand of the individual grid cell and based on a set of neighbor routing demands of the individual set of neighbor grid cells, the congestion map data describing the individual routing demand and the set of neighbor routing demands; and
        modifying the congestion map data to set the individual routing demand based on the average routing demand.

2. The non-transitory computer-readable medium of claim 1, wherein the determining of the average routing demand based on the individual routing demand and the set of neighbor routing demands comprises determining an average of the individual routing demand and the set of neighbor routing demands.

3. The non-transitory computer-readable medium of claim 1, wherein the operations comprise:
    for each individual grid cell in the plurality of grid cells:
        prior to determining the average routing demand, determining a weight for the individual grid cell based on a number of tracks of the individual grid cell, the determining of the average routing demand based on the individual routing demand, the set of neighbor routing demands, and the weight.

4. The non-transitory computer-readable medium of claim 3, wherein the weight comprises the number of tracks divided by an average number of tracks per grid cell for the plurality of grid cells.

5. The non-transitory computer-readable medium of claim 3, wherein the determining of the average routing demand based on the individual routing demand, the set of neighbor routing demands, and the weight comprises determining an average of the individual routing demand and a set of weighted neighbor routing demands, the set of weighted neighbor routing demands being generated by multiplying each neighbor routing demand of the set of neighbor routing demands by the weight.

6. The non-transitory computer-readable medium of claim 1, wherein the individual range is a user-defined value.

7. The non-transitory computer-readable medium of claim 1, wherein the operations performed for each individual grid cell in the plurality of grid cells are repeated for a number of iterations.

8. The non-transitory computer-readable medium of claim 7, wherein the number of iterations is a user-defined value.

9. The non-transitory computer-readable medium of claim 1, wherein the operations comprise:
    for each select grid cell in the plurality of grid cells:
        determining, based on the congestion map data, whether the select grid cell has at least one blocked track;
        determining, based on the congestion map data, whether a select routing demand of the select grid cell indicates routing overflow; and
        in response to the select grid cell having at least one blocked track and the select routing demand indicating routing overflow:
            determining, from the plurality of grid cells, a select set of neighbor grid cells that do not have any blocked tracks, that are in proximity to the select grid cell within a select range, and that satisfy a routing underflow condition; and
            modifying the congestion map data to spread the select routing demand of the select grid cell to one or more grid cells of the select set of neighbor grid cells.

10. The non-transitory computer-readable medium of claim 9, wherein the modifying of the congestion map data to spread the select routing demand of the select grid cell to the one or more grid cells of the select set of neighbor grid cells comprises:
    transferring at least some portion of the select routing demand from the select routing demand to an associated routing demand of a neighbor grid cell, in the select set of neighbor grid cells, based on a first routing capacity of the select grid cell and a second routing capacity of the neighbor grid cell.

11. The non-transitory computer-readable medium of claim 9, wherein the routing underflow condition is satisfied by a neighbor grid cell when an associated routing demand of the neighbor grid cell is less than an associated routing capacity of the neighbor grid cell minus one.

12. A method comprising:
    performing a global routing process on a circuit design to generate congestion map data for the circuit design, the congestion map data describing routing congestion for a plurality of grid cells of the circuit design;
    for each individual grid cell in the plurality of grid cells:
        determining, based on the congestion map data, whether the individual grid cell has at least one blocked track;
        determining, based on the congestion map data, whether an individual routing demand of the individual grid cell indicates routing overflow; and
        in response to the individual grid cell having at least one blocked track and the individual routing demand indicating routing overflow:
            determining, from the plurality of grid cells, an individual set of neighbor grid cells that do not have any blocked tracks, that are in proximity to the individual grid cell within an individual range, and that satisfy a routing underflow condition; and modifying the congestion map data to spread the individual routing demand to one or more grid cells of the individual set of neighbor grid cells; and for each select grid cell in the plurality of grid cells;
determining, from the plurality of grid cells, a select set of neighbor grid cells that are in proximity to the select grid cell within a select range;
determining an average routing demand based on a select routing demand of the select grid cell and based on a set of neighbor routing demands of the select set of neighbor grid cells, the congestion map data describing the select routing demand and the set of neighbor routing demands; and
modifying the congestion map data to set the select routing demand based on the average routing demand.

13. The method of claim 12, wherein the modifying of the congestion map data to spread the individual routing demand of the individual grid cell to the one or more grid cells of the individual set of neighbor grid cells comprises:
transferring at least some portion of the individual routing demand from the individual routing demand to an associated routing demand of a neighbor grid cell, in the individual set of neighbor grid cells, based on a first routing capacity of the individual grid cell and a second routing capacity of the neighbor grid cell.

14. The method of claim 12, wherein the routing underflow condition is satisfied by a neighbor grid cell when an associated routing demand of the neighbor grid cell is less than an associated routing capacity of the neighbor grid cell minus one.

15. The method of claim 12, wherein the determining of the average routing demand based on the select routing demand and the set of neighbor routing demands comprises determining an average of the select routing demand and the set of neighbor routing demands.

16. The method of claim 12, comprising:
prior to determining the average routing demand, determining a weight for the select grid cell based on a number of tracks of the select grid cell, the determining of the average routing demand based on the select routing demand, the set of neighbor routing demands, and the weight.

17. The method of claim 16, wherein the weight comprises the number of tracks divided by an average number of tracks per grid cell for the plurality of grid cells.

18. The method of claim 16, wherein the determining of the average routing demand based on the select routing demand, the set of neighbor routing demands, and the weight comprises determining an average of the select routing demand and a set of weighted neighbor routing demands, the set of weighted neighbor routing demands being generated by multiplying each neighbor routing demand of the set of neighbor routing demands by the weight.

19. A device comprising:
a memory storing instructions; and
a hardware processor communicatively coupled to the memory and configured by the instructions to perform operations comprising:
accessing congestion map data for a circuit design, the congestion map data describing routing congestion for a plurality of grid cells of the circuit design; and
for each individual grid cell in the plurality of grid cells:
determining, from the plurality of grid cells, an individual set of neighbor grid cells that are in proximity to the individual grid cell within an individual range;
determining an average routing demand based on an individual routing demand of the individual grid cell and based on a set of neighbor routing demands of the individual set of neighbor grid cells, the congestion map data describing the individual routing demand and the set of neighbor routing demands; and
modifying the congestion map data to set the individual routing demand based on the average routing demand.

* * * * *